(12) United States Patent
Takahashi et al.

(10) Patent No.: US 6,645,794 B2
(45) Date of Patent: Nov. 11, 2003

(54) METHOD OF MANUFACTURING A SEMICONDUCTOR DEVICE BY MONOLITHICALLY FORMING A SEALING RESIN FOR SEALING A CHIP AND A REINFORCING FRAME BY TRANSFER MOLDING

(75) Inventors: Noriyuki Takahashi, Yonezawa (JP); Seiichi Ichihara, Hino (JP); Chuichi Miyazaki, Akishima (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/302,848

(22) Filed: Nov. 25, 2002

(65) Prior Publication Data

US 2003/0073266 A1 Apr. 17, 2003

Related U.S. Application Data

(62) Division of application No. 09/673,574, filed as application No. PCT/JP98/01920 on Apr. 24, 1998.

(51) Int. Cl.$^7$ .................. H01L 21/44; H01L 21/48; H01L 21/50
(52) U.S. Cl. ............................................. 438/127
(58) Field of Search .............................. 438/125, 126, 438/127

(56) References Cited

U.S. PATENT DOCUMENTS 5,729,051 A   3/1998   Nakamura
5,763,939 A   6/1998   Yamashita
5,793,118 A   8/1998   Nakajima
5,895,965 A   4/1999   Tanaka et al.
5,989,940 A   11/1999  Nakajima
6,118,183 A   9/2000   Umehara

FOREIGN PATENT DOCUMENTS

| JP | 7-321248  | 12/1995 |
| JP | 8-88243   | 4/1996  |
| JP | 8-111433  | 4/1996  |
| JP | 9-162233  | 6/1997  |
| JP | 10-79401  | 3/1998  |
| JP | 10-98072  | 4/1998  |

*Primary Examiner*—Michael S. Lebentritt
*Assistant Examiner*—Beth E. Owens
(74) *Attorney, Agent, or Firm*—Mattingly, Stanger & Malur, P.C.

(57) ABSTRACT

In a semiconductor device manufacturing method in which a package including a semiconductor chip is mounted on a wiring board via tape ball grid array (TBGA), a tape base material having a device hole and a plurality of leads is provided with one end of the leads extended inside the device hole and a part of the other end of the leads forming lands for connecting bump electrodes. The semiconductor chip is arranged in the device hole of the tape base material to electrically connect the semiconductor chip and the one end of the leads. A sealing resin and reinforcing frame surrounding the periphery of the sealing resin are monolithically formed by transfer molding. The tape base material is fixed in an area between the semiconductor chip and the reinforcing frame by a lower mold and a projection of an upper mold.

3 Claims, 23 Drawing Sheets

METHOD OF MANUFACTURING A SEMICONDUCTOR DEVICE BY MONOLITHICALLY FORMING A SEALING RESIN FOR SEALING A CHIP AND A REINFORCING FRAME BY TRANSFER MOLDING

This is a divisional application of U.S. Ser. No. 09/673,574, filed Oct. 18, 2000, which is a 371 of PCT/JP98/01920, filed Apr. 24, 1998.

TECHNICAL FIELD

The present invention relates to a semiconductor device and its manufacturing method, particularly relates to technique which is effectively applied to a ball grid array (BGA)-type semiconductor device wherein a package including a semiconductor chip is mounted on a printed wiring board via a solder bump.

BACKGROUND ART

A ball grid array (BGA) wherein a solder bump is mounted on one surface of a package including a semiconductor chip and the package is mounted on a printed wiring board via the solder bump has an advantage that multiple pins can be more easily provided, compared with a quad flat package (QFP) from the sides of which leads are pulled out and a small outline package (SOP) and packaging area can be reduced.

For the BGA, various structures are proposed, however, particularly, for BGA suitable for packaging to small lightweight electronic equipment such as portable information equipment, a digital camera and a notebook-sized personal computer, a tape carrier package (TCP) in which a package is configured by an insulating tape is well-known. This type of tape BGA (TBGA) is disclosed in Japanese published unexamined patent applications No. Hei 7(1995)-321248, No. Hei 8(1996)-88243 and No. Hei 8(1996)-111433 for example.

Also, these inventors develop BGA provided with the following structure (particularly fine pitch BGA in which pitch between bumps is narrowed). For the BGA, a device hole is formed in the center of a wiring board made of resin on one side of which plural leads made of Cu (copper) foil are formed, a semiconductor chip is arranged there, the semiconductor chip and one end of the lead are electrically connected via a bump electrode made of Au and the main surface of the semiconductor chip is sealed with potting resin. Also, the other end of the lead is extended to the periphery of the wiring board to be a land, and a solder bump to be a terminal for connecting to an external device of BGA is connected to the land.

Further, for reinforcing materials for enabling securely positioning the solder bump in the land in a process for assembling the BGA, a square metallic frame is applied on the surface on the reverse side of the surface to which solder bumps are bonded in the periphery of the wiring board by an adhesive, and prevents the periphery of the wiring board from being warped.

However, as the metallic frame used for the BGA is formed by stamping a thin metallic plate made of Cu (copper) or the like using a press, applying an adhesive to one side and further applying a cover tape for protecting the adhesive to the surface, the material is high-priced and it increases the manufacturing cost of the BGA. Also, as work for applying the metallic frame to the wiring board is required, the number of manufacturing processes for the BGA is increased. In this work for applying the metallic frame, removing the thin cover tape for protecting the adhesive cannot be well performed by a robot hand, it is also difficult to reduce the cost by automation.

The object of the invention is to provide technique that can reduce the manufacturing cost of BGA including tape BGA and fine pitch BGA.

Another object of the invention is to provide technique that can enhance the reliability of BGA including tape BGA and fine pitch BGA.

The object, another object and new characteristics of the invention will be clear from the description of the specification and attached drawings.

DISCLOSURE OF THE INVENTION

The summary of the representative of the inventions disclosed in the present invention will be briefly described below.

A semiconductor device according to the invention is provided with a semiconductor chip, a wiring board provided so that the wiring board surrounds the semiconductor chip, plural leads which are formed on the wiring board and one end of which is electrically connected to the semiconductor chip, sealing resin for coating the semiconductor chip, a reinforcing frame provided along the periphery of the wiring board, and plural bumps arranged along the periphery of the wiring board and electrically connected to the other end of the lead, and the reinforcing frame is made of resin.

Also, a semiconductor device according to the invention is provided with a semiconductor chip, a wiring board provided so that the wiring board surrounds the semiconductor chip, plural leads which are formed on the wiring board and one end of which is electrically connected to the semiconductor chip, sealing resin for coating the semiconductor chip, a reinforcing frame provided along the periphery of one main surface of the wiring board, and plural bumps arranged along the periphery of the other main surface of the wiring board and electrically connected to the other end of the lead, the reinforcing frame is made of resin, a through hole that pierces the upper and lower surfaces of the reinforcing frame and the wiring board and reaches the lead is provided to the reinforcing frame and the wiring board, and conductive material is embedded inside the through hole.

Also, the manufacturing method of the semiconductor device according to the invention includes the following steps:

(a) a step for arranging the semiconductor chip in the device hole of tape base material having plural leads one end of which is extended inside the device hole and in a part of the other end of which a land for connecting a bump is formed, and electrically connecting the semiconductor chip and one end of the lead;

(b) a step for forming the sealing resin for sealing the semiconductor chip and the reinforcing frame that surrounds the sealing resin by transfer molding;

(c) a step for connecting a bump to the land of the lead; and (d) a step for removing an unnecessary part of the tape base material.

As a method for providing a high-priced metallic frame to the wiring board is not required according to the invention described above, the cost of the material and the number of manufacturing processes can be reduced and BGA of a low cost can be provided. Also, BGA whose reliability is enhanced can be provided by sealing the semiconductor chip with resin by transfer molding.

BEST MODES FOR CARRYING OUT THE INVENTION

Figure 1:
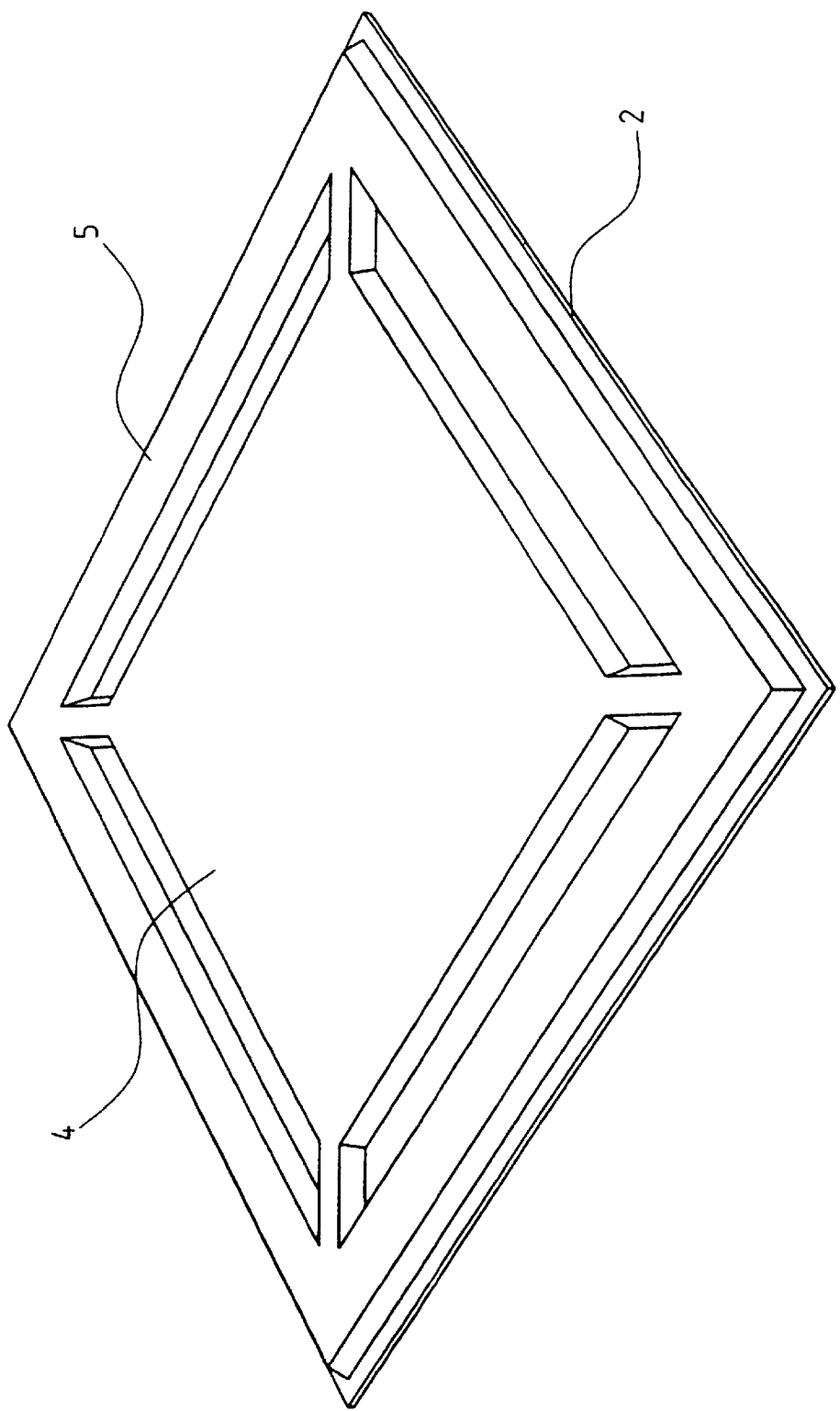
FIGS. 1 and 2 are perspective views showing a semiconductor device equivalent to a first embodiment of the invention.

Referring to the drawings, embodiments of the invention will be described in detail below. The same reference number is allocated to a component having the same function in all the drawings for explaining the embodiments and the repeated description is omitted.

First Embodiment

Figure 2:
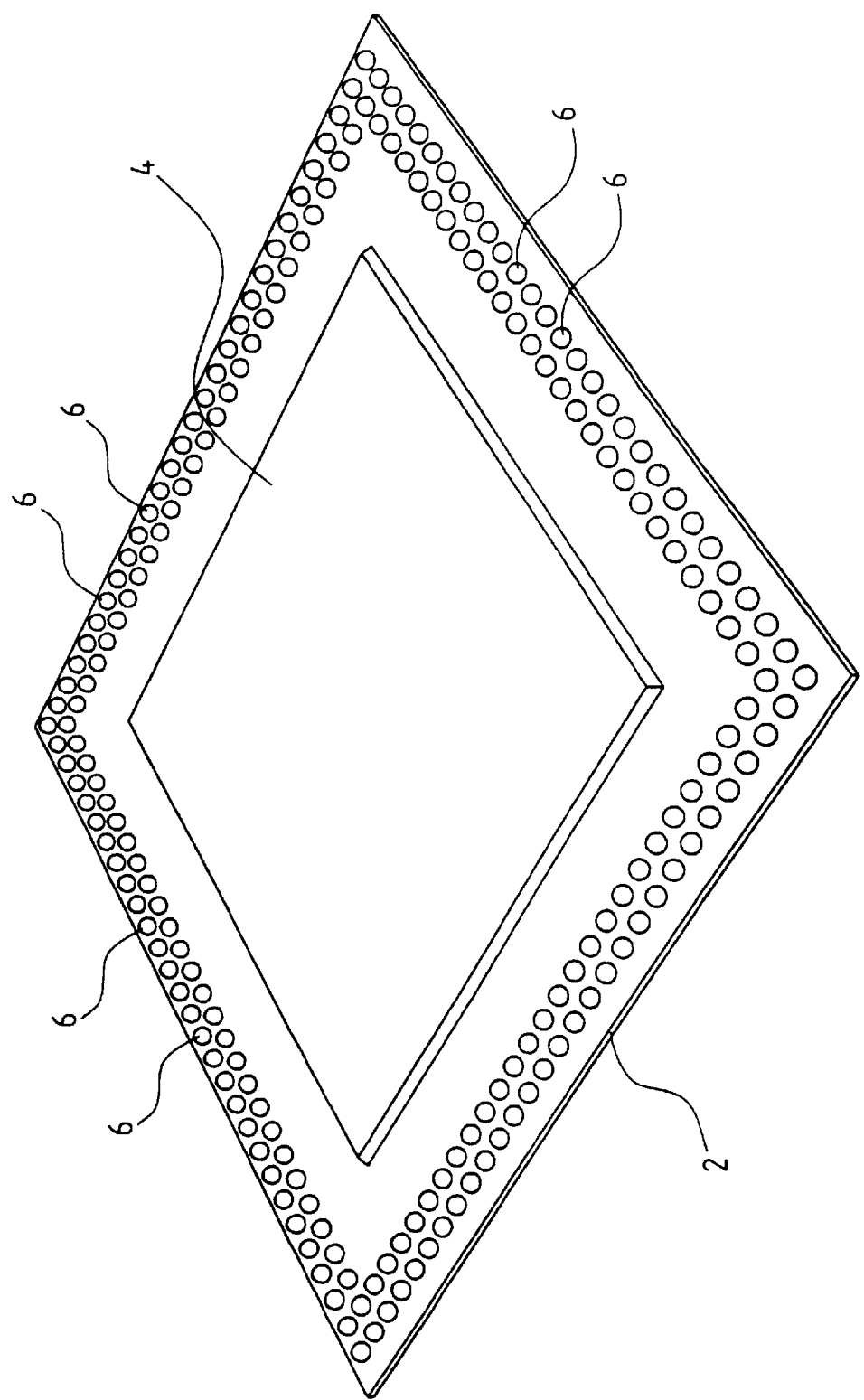
Figure 3:
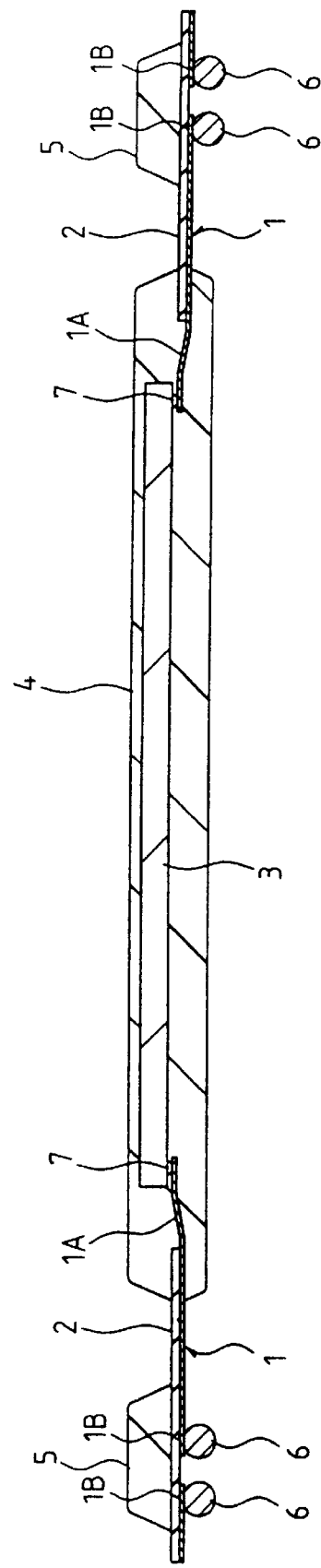
FIG. 3 is a sectional view showing the semiconductor device equivalent to the first embodiment of the invention.

FIG. 1 is a perspective view showing a tape ball grid array (TBGA) (fine pitch BGA) in this embodiment, FIG. 2 is a perspective view showing the mounted surface (the surface on which solder bumps are mounted) of the TBGA and FIG. 3 is a sectional view showing the TBGA.

The TBGA in this embodiment is comprised of a wiring board 2 made of polyimide resin on one side of which plural leads 1 made of copper foil are formed, a semiconductor chip 3 arranged in a device hole of the wiring board 2, sealing resin 4 coating the semiconductor chip 3, a square reinforcing frame 5 provided along the periphery of the wiring board 2, and plural solder bumps 6 mounted along the periphery of the wiring board 2.

The semiconductor chip 3 wherein LSI such as a microcomputer and ASIC is formed is electrically connected to one end (an inner lead 1A) of the lead 1 via a bump electrode 7 made of Au provided in the periphery of the main surface. The other end of the lead 1 is extended under the reinforcing frame 5 provided in the periphery of the wiring board 2 and is electrically connected to the solder bump 6 in this area. One side of the wiring board 2 except the other end (a land 1B) of the lead 1 to which the solder bump 6 is bonded is coated with solder resist (not shown) for protecting the lead 1.

The reinforcing frame 5 provided in the periphery of the wiring board 2, that is, an area where the solder bump 6 is mounted functions to secure the flatness of the periphery of the wiring board 2 and securely bond the solder bump 6 to the land 1B in a process described later for mounting the solder bump 6. The reinforcing frame 5 is made of synthetic resin formed by transfer molding.

The sealing resin 4 for protecting the semiconductor chip 3 from external environment is made of synthetic resin formed by transfer molding as the reinforcing frame 5 and covers the overall surface of the semiconductor chip 3. As shown in FIG. 1, the sealing resin 4 is connected to the reinforcing frame 5 at four corners and is integrated with the reinforcing frame 5.

For an example of the material and the dimension of each part of the TBGA, the semiconductor chip 3 is made of monocrystalline silicon, the dimension is 7.6×7.6 mm and the thickness is 0.4 mm. The dimension of the wiring board 2 made of polyimide resin is 15×15 mm and the thickness is 0.075 mm. The lead 1 is made of copper foil formed by etching electrolytic copper foil (or rolled copper foil) 0.018 mm thick applied to one side of the wiring board 2 and the surface of both ends (the inner lead 1A and the land 1B) is plated with Au/Ni.

The sealing resin 4 for sealing the semiconductor chip 3 and the reinforcing frame 5 integrated with the sealing resin are made of epoxy resin including filler such as silica. The dimension of the sealing resin 4 is 14.6×14.6 mm and the thickness is 0.655 mm. The reinforcing frame 5 is formed only on one side of the wiring board 2 and the thickness is 0.355 mm. The solder bump 6 bonded to the land 1B of the lead 1 is made of an alloy of Sn (accounting for 63%) and Pb (accounting for 37%), the diameter is 0.3 mm and the pitch is 0.5 mm.

Next, referring to FIGS. 4 to 11, the manufacturing method of the TBGA in this embodiment comprised as described above will be described.

Figure 4:
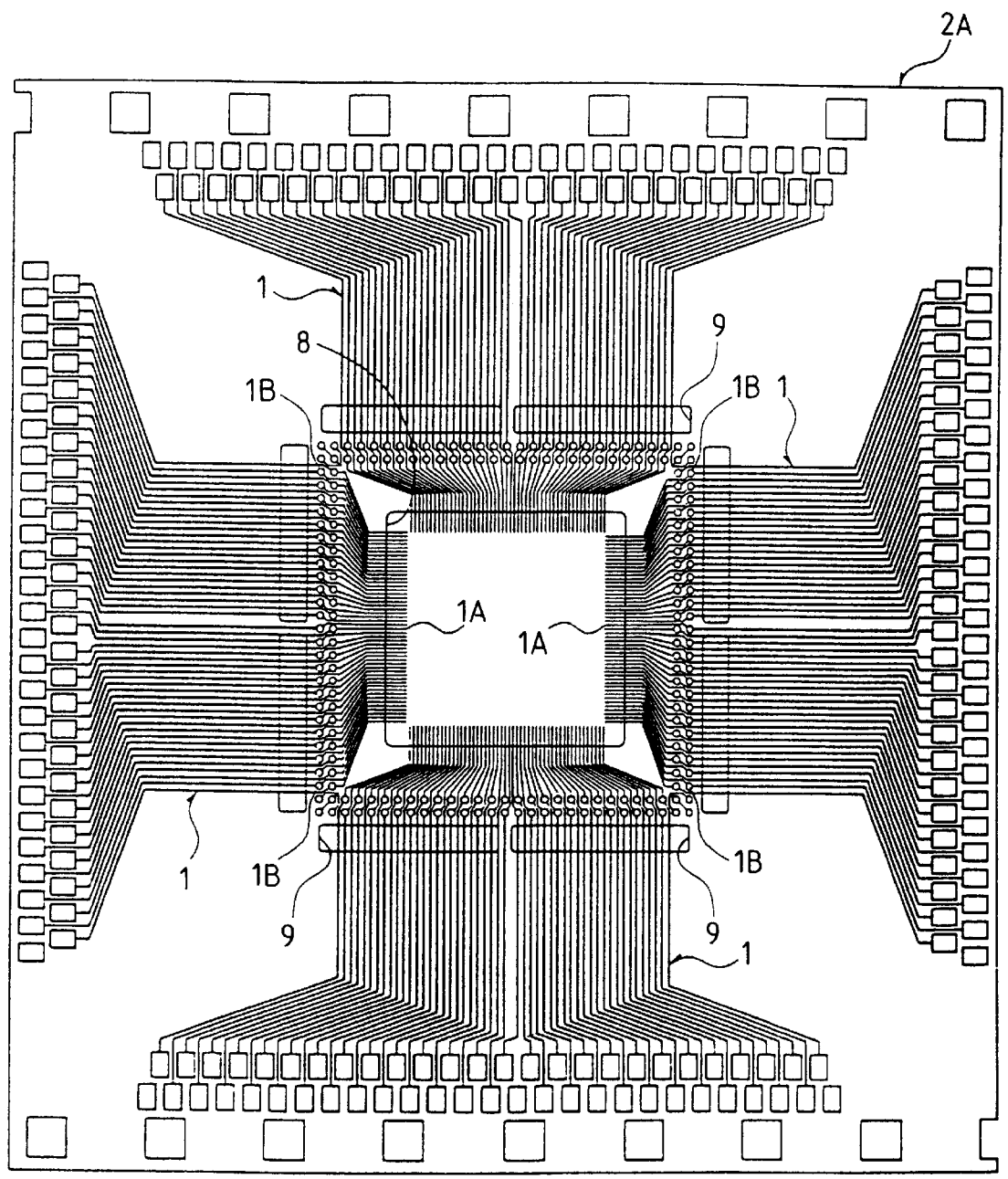
FIG. 4 is a plan of tape base material showing a manufacturing method of the semiconductor device equivalent to the first embodiment of the invention.
Figure 5:
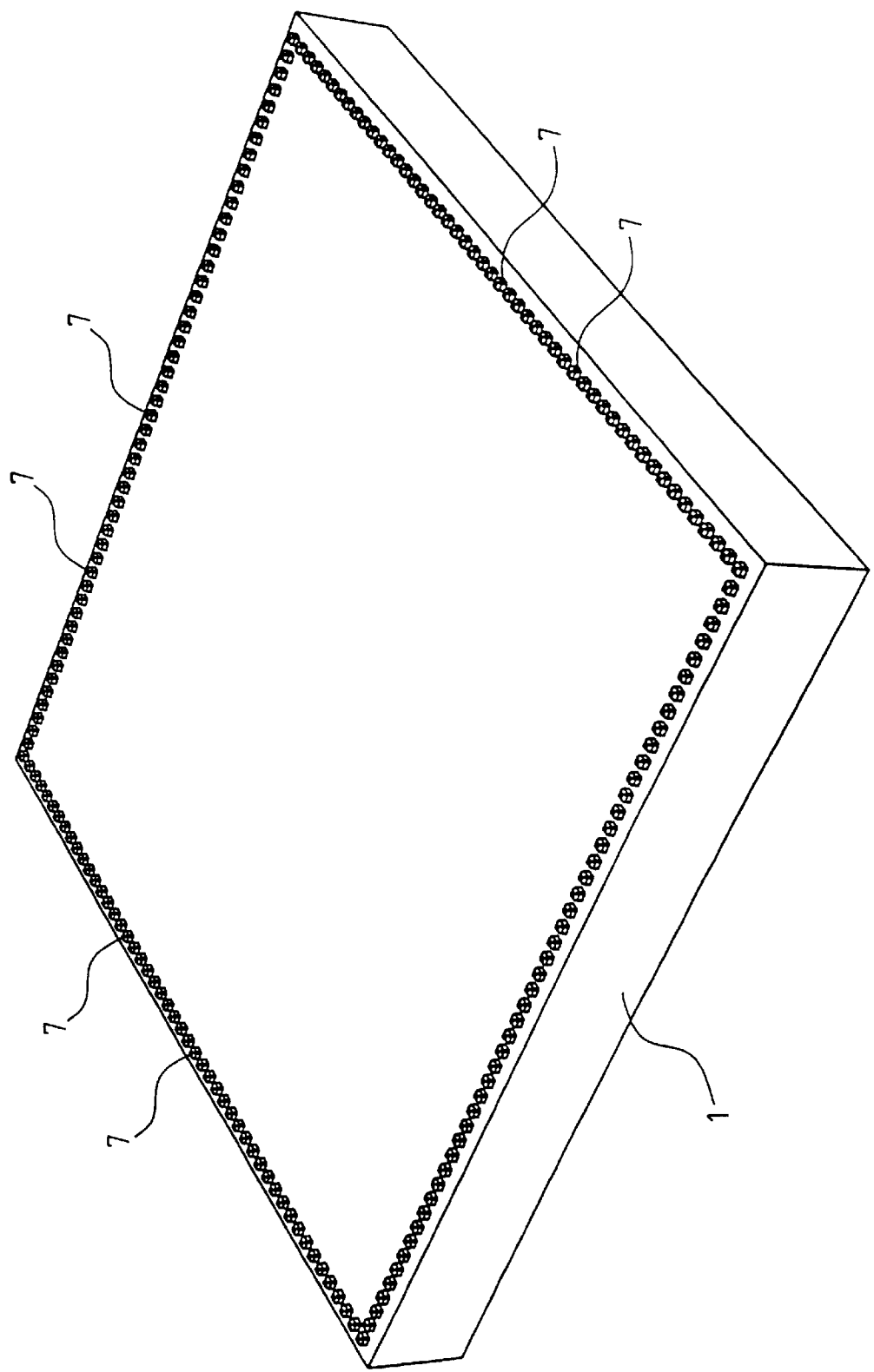
FIG. 5 is a perspective view showing the manufacturing method of the semiconductor device equivalent to the first embodiment of the invention.

To manufacture TBGA, first, tape base material 2A shown in FIG. 4 on one side of which the lead 1 made of copper foil is formed and where a through hole is formed and the semiconductor chip 3 shown in FIG. 5 in the periphery of the surface on which elements are formed of which the bump electrode 7 made of Au is formed are prepared.

The tape base material 2A is a long tape 35 mm wide one end of which is wound on a reel, however, only an area equivalent to one BGA is shown in FIG. 4. A device hole 8 substantially square in which the semiconductor chip 3 is arranged is formed in the center of the area equivalent to one BGA of the tape base material 2A and one end (the inner lead 1A) of each lead 1 is extended inside the device hole 8. Also, the land 1B to which the solder bump 6 is connected in the following process is formed in the halfway part of the lead 1. These lands 1B are arranged in two rows along each side of the device hole 8. A rectangular aperture 9 is formed in the tape base material 2A further outside the land 1B so that the apertures 9 surround the lands 1B. These apertures 9 are provided to facilitate work for stamping the tape base material 2A so that the tape base material 2A inside the apertures configures the wiring board 2 of BGA.

In the meantime, the bump electrode 7 is mounted on the semiconductor chip 3 according to ball bonding using a wiring bonding apparatus.

Figure 6:
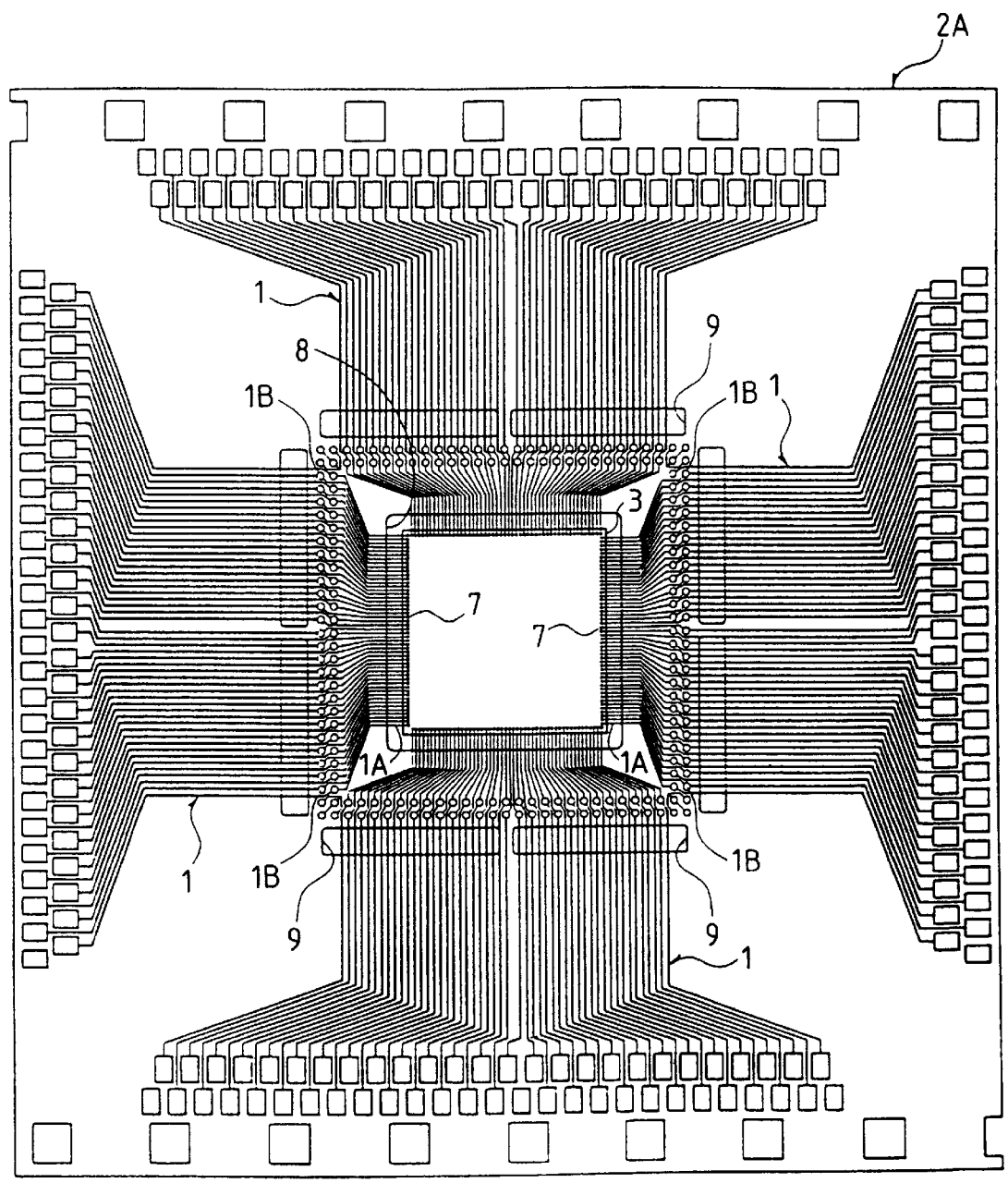
FIG. 6 is a plan showing the manufacturing method of the semiconductor device equivalent to the first embodiment of the invention.
Figure 7:
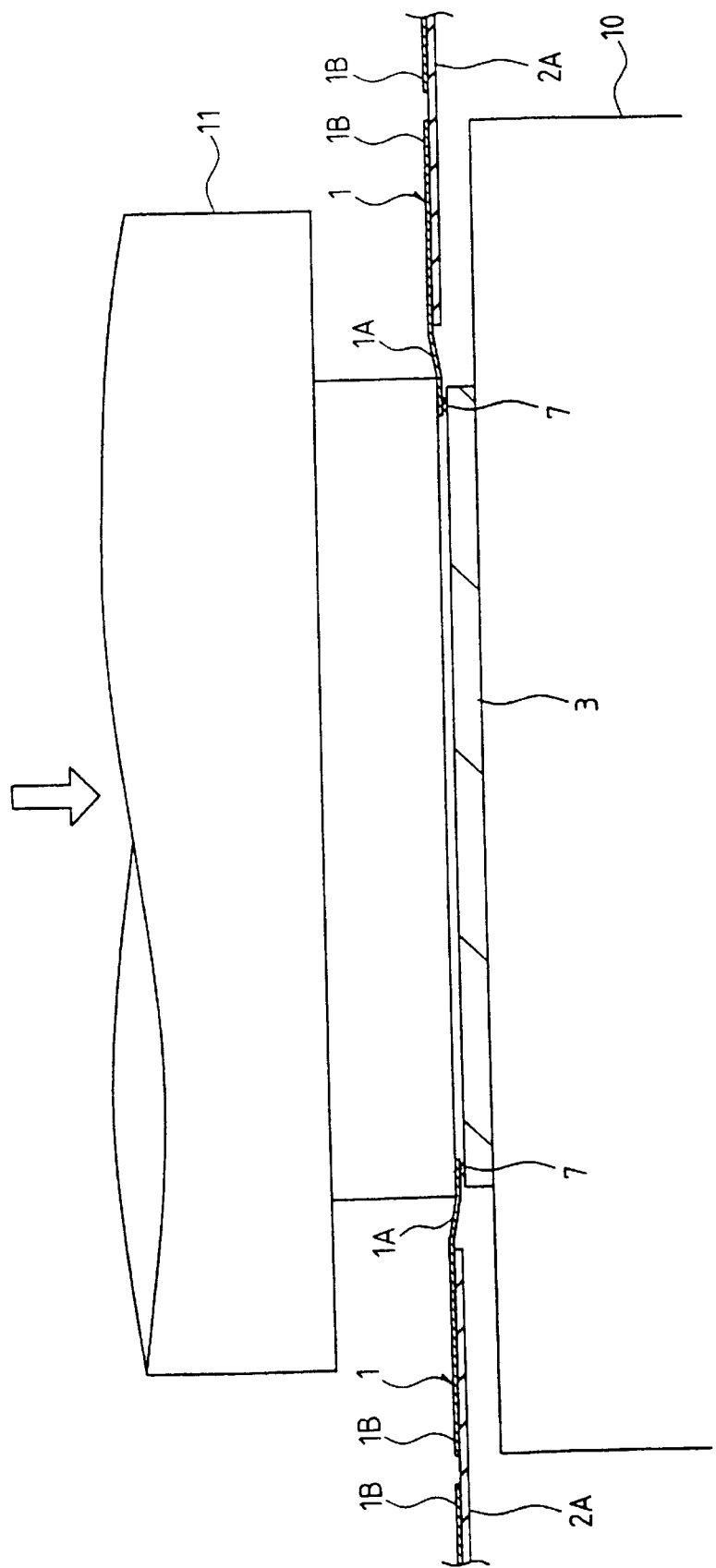
FIGS. 7 and 8 are schematic sectional views showing the manufacturing method of the semiconductor device equivalent to the first embodiment of the invention.

Next, as shown in FIG. 6, the semiconductor chip is positioned in the device hole 8 of the tape base material 2A, and the bump electrode 7 and the corresponding lead 1 are electrically connected. To connecting the bump electrode 7 and the lead 1, the inner lead 1A of the lead 1 is superimposed on the bump electrode 7 of the semiconductor chip 3 horizontally laid on a bonding stage 10 as shown in FIG. 7, a bonding tool 11 heated up to approximately 500° C. is pressed for approximately one second from the top, and all the bump electrodes 7 and the corresponding inner leads 1A are simultaneously collectively connected.

Figure 8:
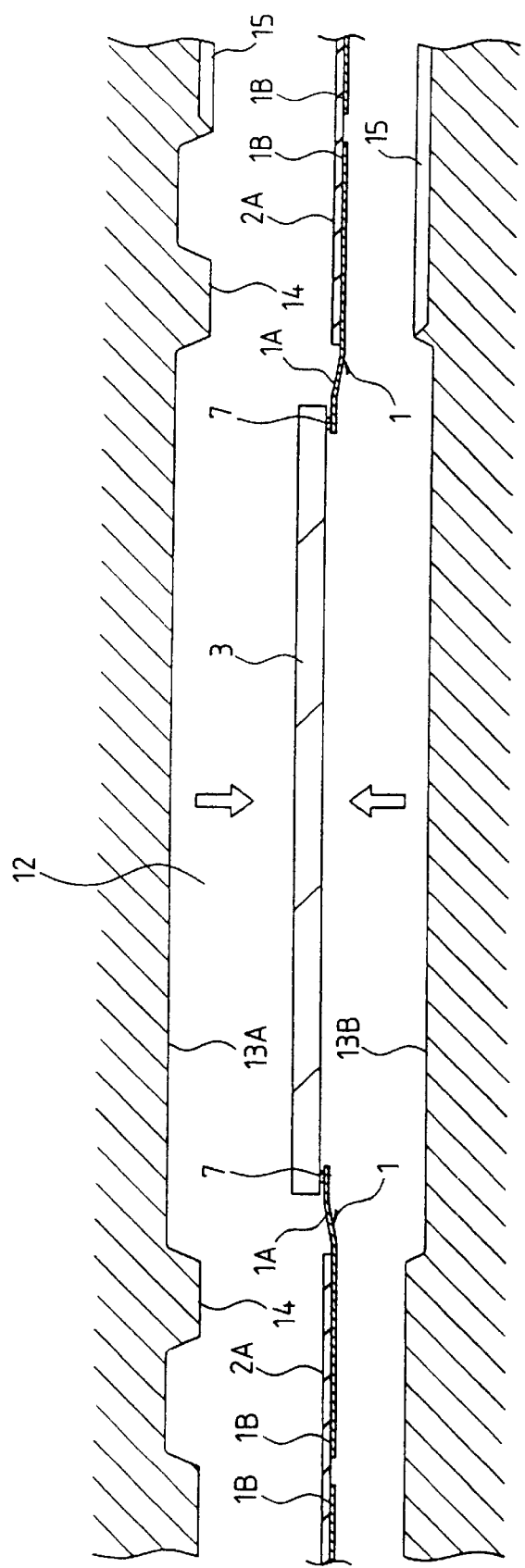

Next, the tape base material 2A is mounted on a mold shown in FIG. 8 and resin is injected inside of a cavity 12 in which the semiconductor chip 3 is positioned. As shown in FIG. 8, the mold is comprised of an upper mold 13A and a lower mold 13B. A projection 14 is provided to a part of the upper mold 13A, resin injected in the cavity 12 in a part inside the projection 14 becomes the sealing resin 4 for sealing the semiconductor chip 3 and the resin injected in the cavity in a part outside the projection becomes the reinforcing frame 5. Also, the tape base material 2A in an area close to the semiconductor chip 3 is securely fixed between the projection 14 and the lower mold 13B by providing the projection 14 in a part of the upper mold 13A. Hereby, as the semiconductor chip 3 hardly fluctuates when resin is injected inside the cavity 12, a percent defective of forming caused by the misregistration of the semiconductor chip 3 can be reduced.

Also, a gate 15 which is a filler hole of resin is provided to the upper mold 13A and the lower mold 13B of the mold. Hereby, as resin is uniformly injected into the side of the main surface and the side of the back surface of the semiconductor chip 3, a percent defective of forming caused by the dispersion of the injection of resin can be reduced.

Figure 9:
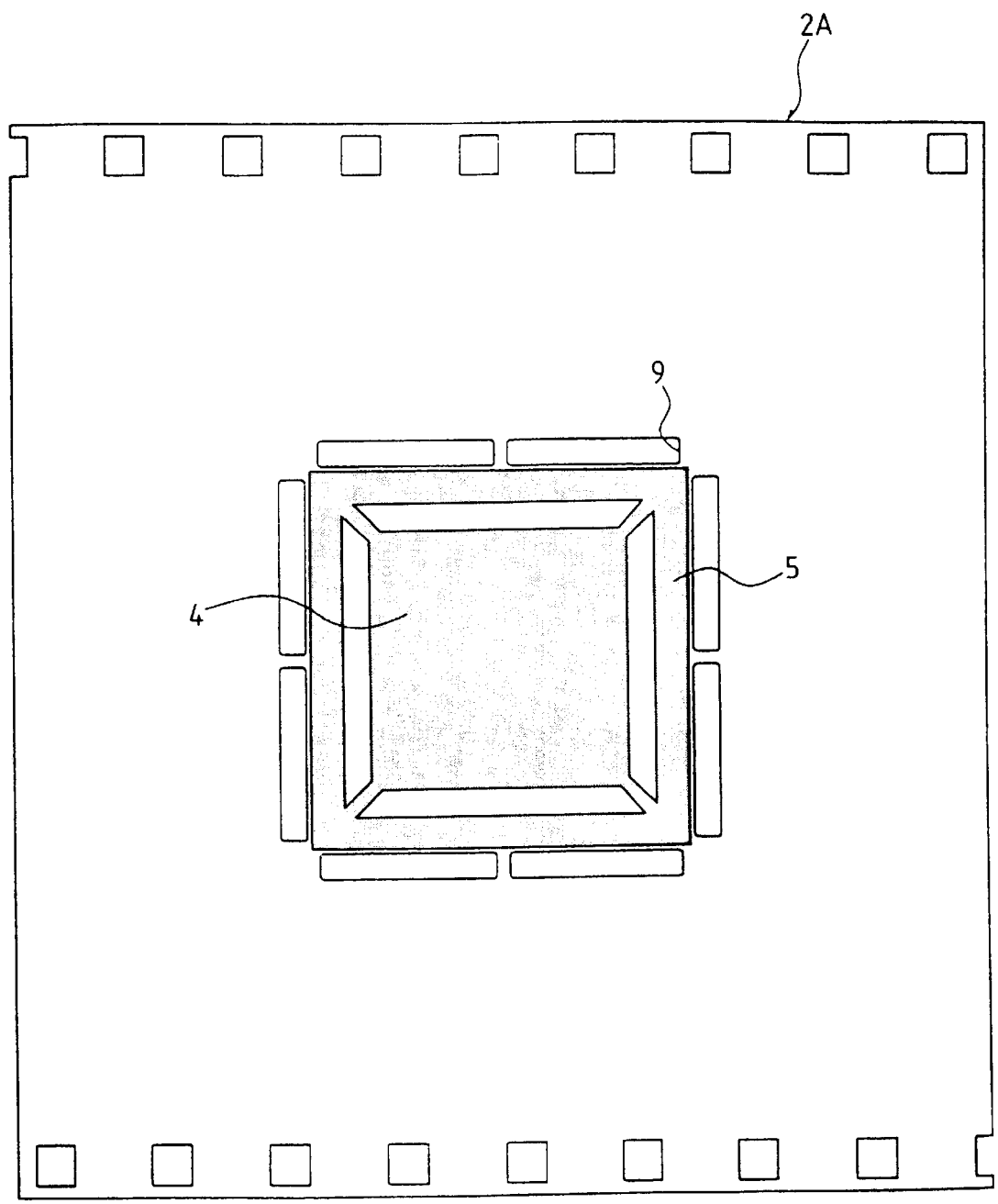
FIGS. 9 and 10 are plans showing the manufacturing method of the semiconductor device equivalent to the first embodiment of the invention.
Figure 10:
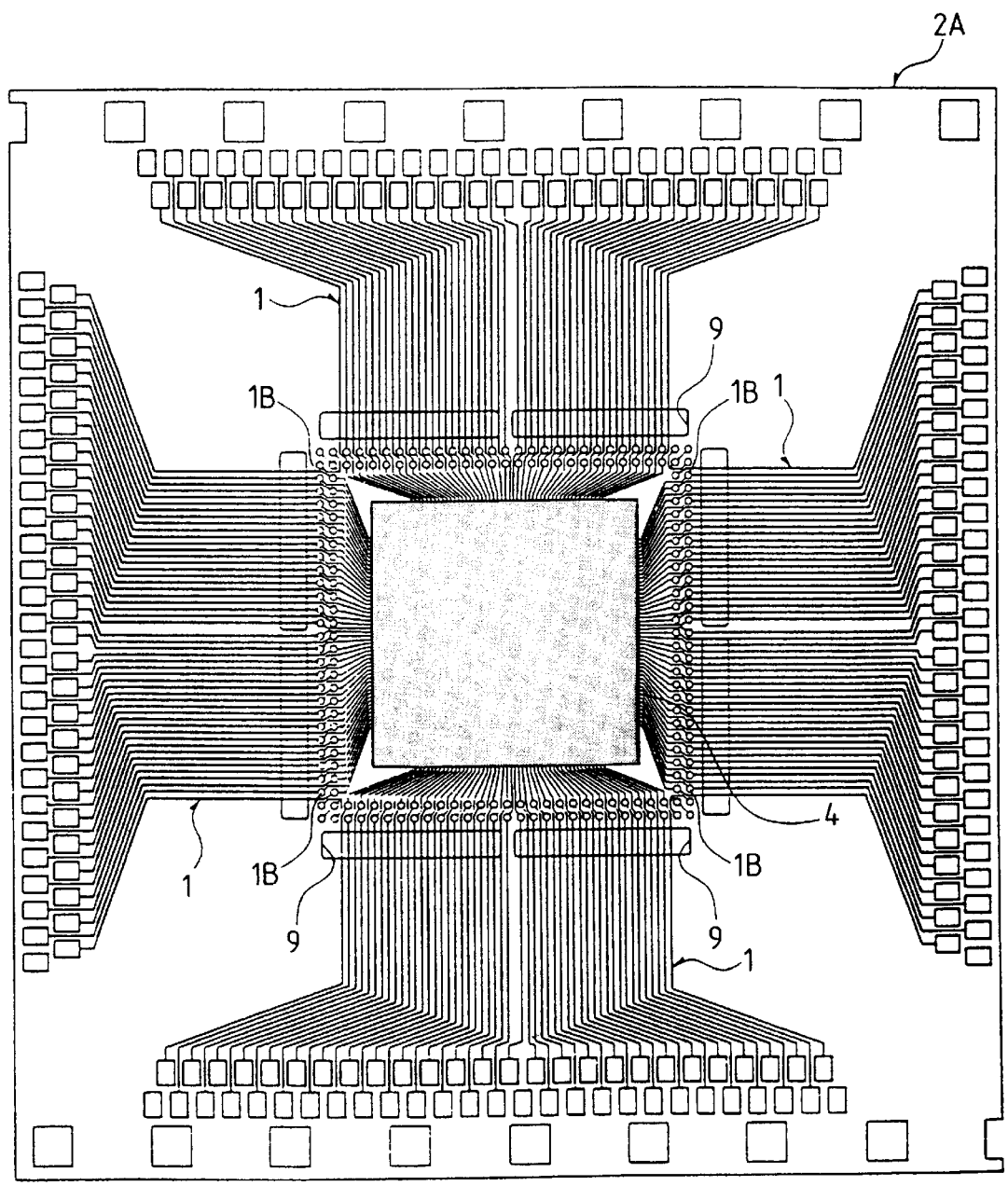
Figure 11:
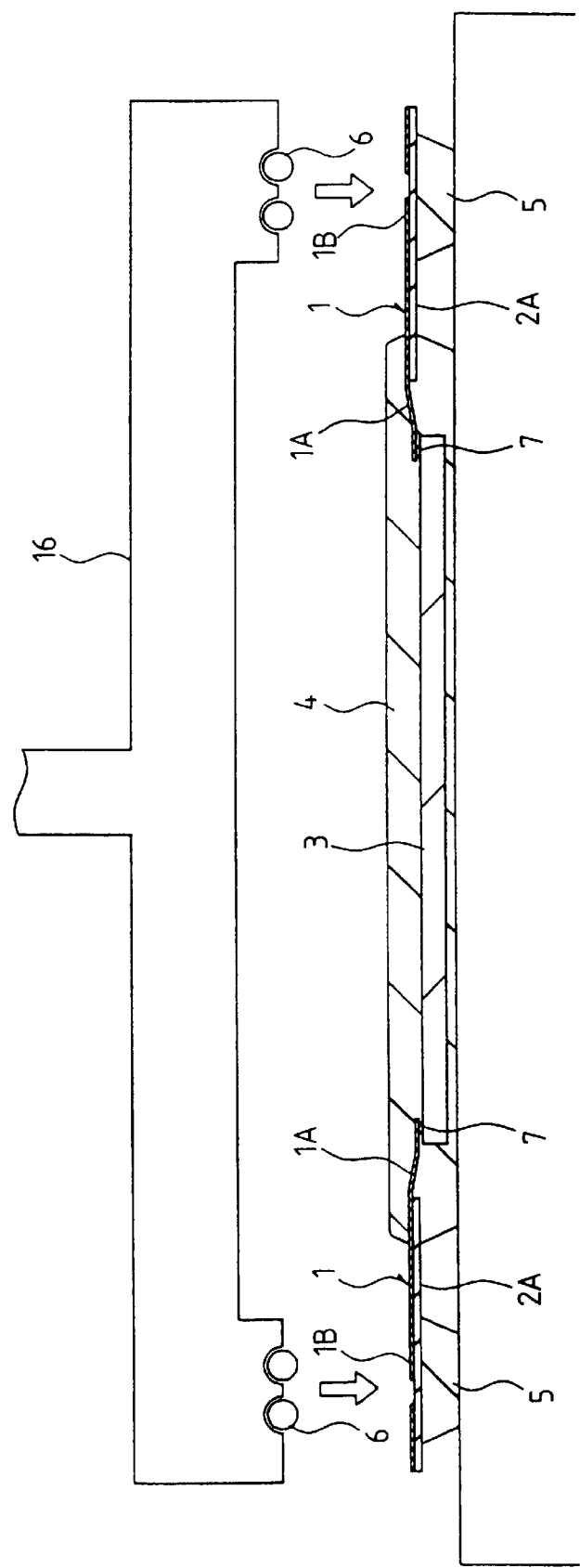
FIG. 11 is a schematic sectional view showing the manufacturing method of the semiconductor device equivalent to the first embodiment of the invention.

FIG. 9 is a plan showing the tape base material 2A (the upper surface side) on which the sealing resin 4 and the reinforcing frame 5 are formed by transfer molding using the mold and FIG. 10 is a plan showing the tape base material 2 (the mounting surface side).

Next, the solder bump 6 is connected to the land 1B of the tape base material 2A. To connect the solder bump 6 to the land 1B, the solder bump 6 formed in the shape of a ball beforehand is vacuumly sucked using a ball mounter 16 shown in FIG. 11 and after the solder bump 6 is dipped in a flux vessel (not shown) in this state and flux is applied to the surface, the solder bump 6 is tacked to the corresponding land 1B utilizing the adhesion of flux. In this embodiment, as the reinforcing frame 5 is provided to the tape base material 2A in an area in which the land 1B is formed, the tape base material 2A in this area is prevented from being warped and deformed and the degree of flatness is enhanced. Therefore, even if multiple solder bumps 6 are simultaneously pressed on the corresponding lands 1B, all the solder bumps 6 securely closely adhere to the bands 1B.

Afterward, after the solder bump 6 is fixed on the land 1B after reflowing, the residue of flux left on the surface of the tape base material 2A is removed using neutral detergent or the like and finally, the TBGA shown in FIGS. 1 to 3 is completed by stamping the tape base material 2A in units of chip. After the TBGA acquired hereby is tested by a burn-in tester and is sorted into a non-defective device or a defective device, it is packaged and shipped.

Figure 12:
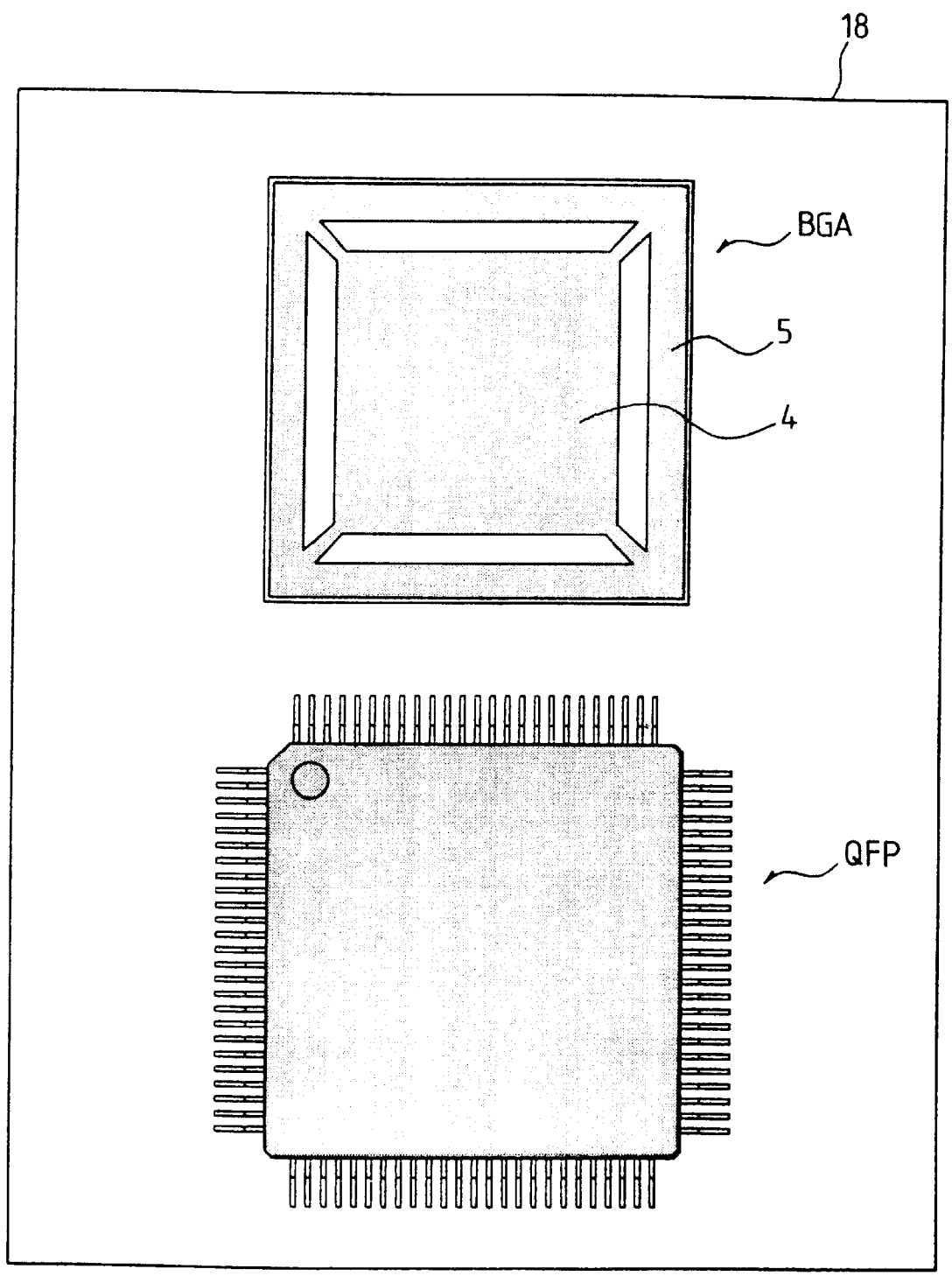
FIG. 12 is a plan showing a printed wiring board on which the semiconductor device equivalent to the first embodiment of the invention is mounted.

FIG. 12 is a plan showing a printed wiring board 18 on which the TBGA and another surface mounting-type package such as QFP are mounted. The TBGA and QFP are simultaneously collectively mounted by reflowing the solder bump 6 of the TBGA and soldering paste (or solder coating) applied to the surface of the lead of the QFP in a furnace.

As described above, according to this embodiment in which the sealing resin 4 for protecting the semiconductor chip 3 and the reinforcing frame 5 for securing the flatness of the periphery of the wiring board 2 are simultaneously collectively formed by transfer molding, as the number of manufacturing processes can be reduced compared with a case that a semiconductor chip is sealed with potting resin after the metallic frame is bonded to the periphery of a board made of resin, and the cost of the material can be reduced by forming the reinforcing frame by molding resin lower-priced than the metallic frame, the TBGA can be manufactured at a low price.

Also, according to this embodiment in which the semiconductor chip is overall sealed with molding resin more excellent in moisture resistance than potting resin, the reliability of the TBGA can be enhanced.

Second Embodiment

Figure 13:
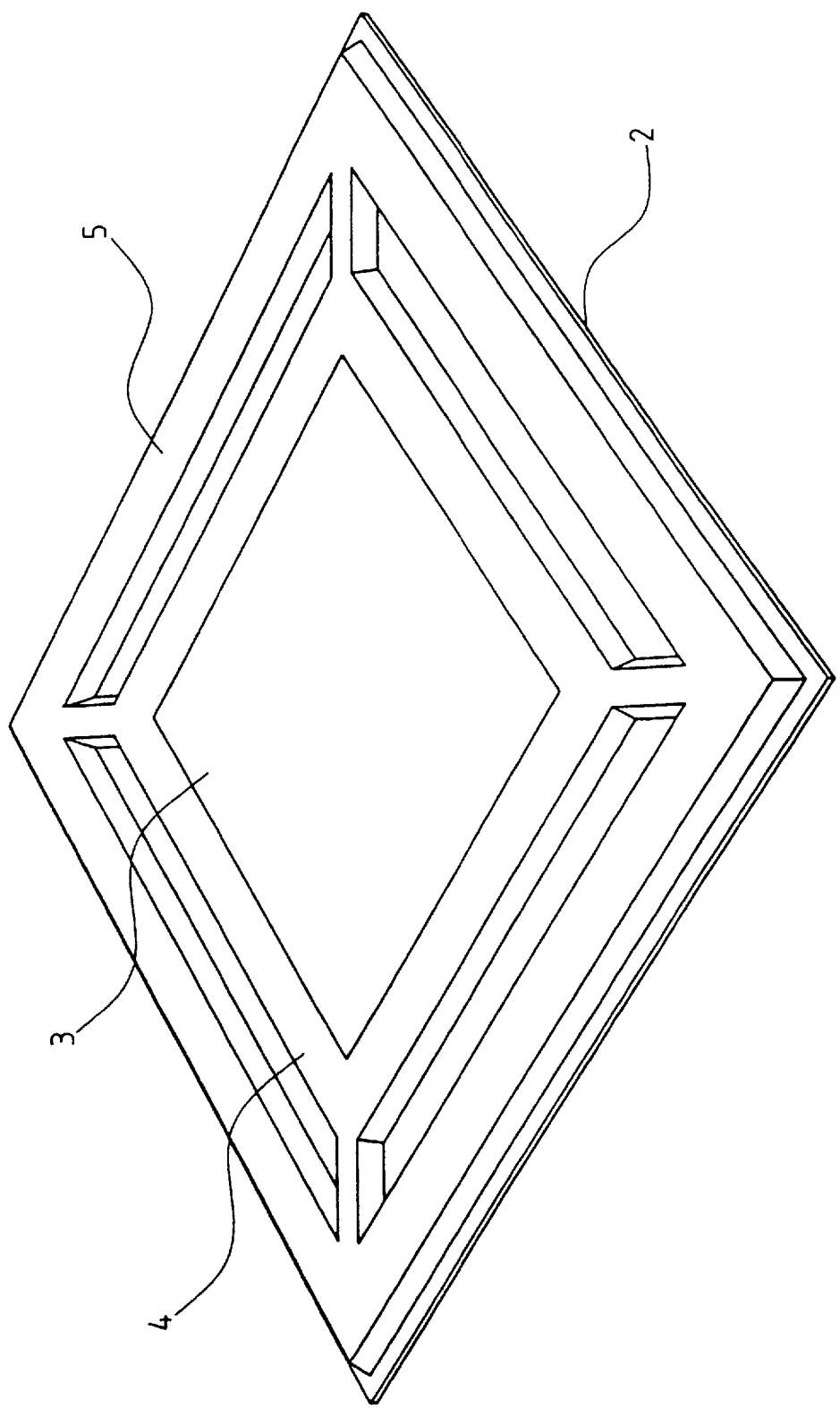
FIG. 13 is a perspective view showing a semiconductor device equivalent to a second embodiment of the invention.
Figure 14:
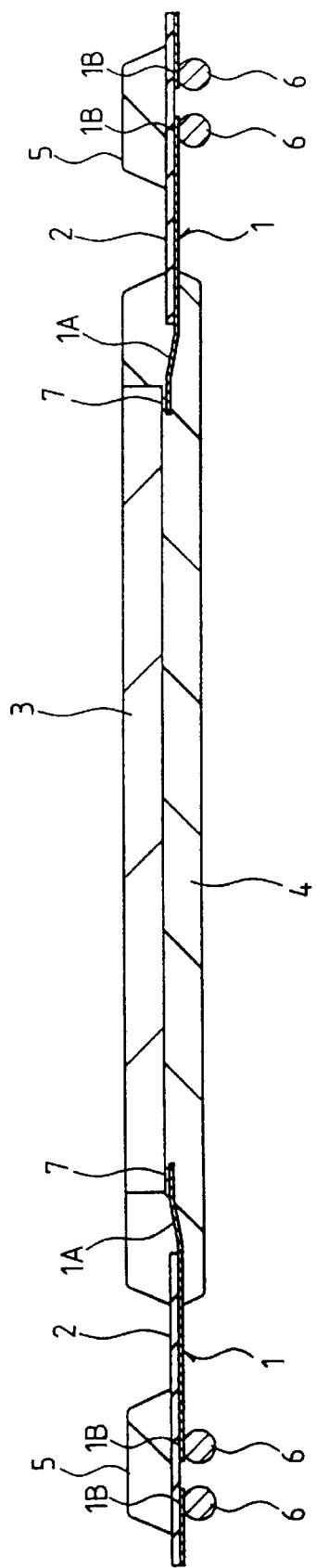
FIGS. 14 and 15 are sectional views showing the semiconductor device equivalent to the second embodiment of the invention.

FIG. 13 is a perspective view showing TBGA equivalent to this embodiment and FIG. 14 is a sectional view showing the TBGA.

Figure 15:
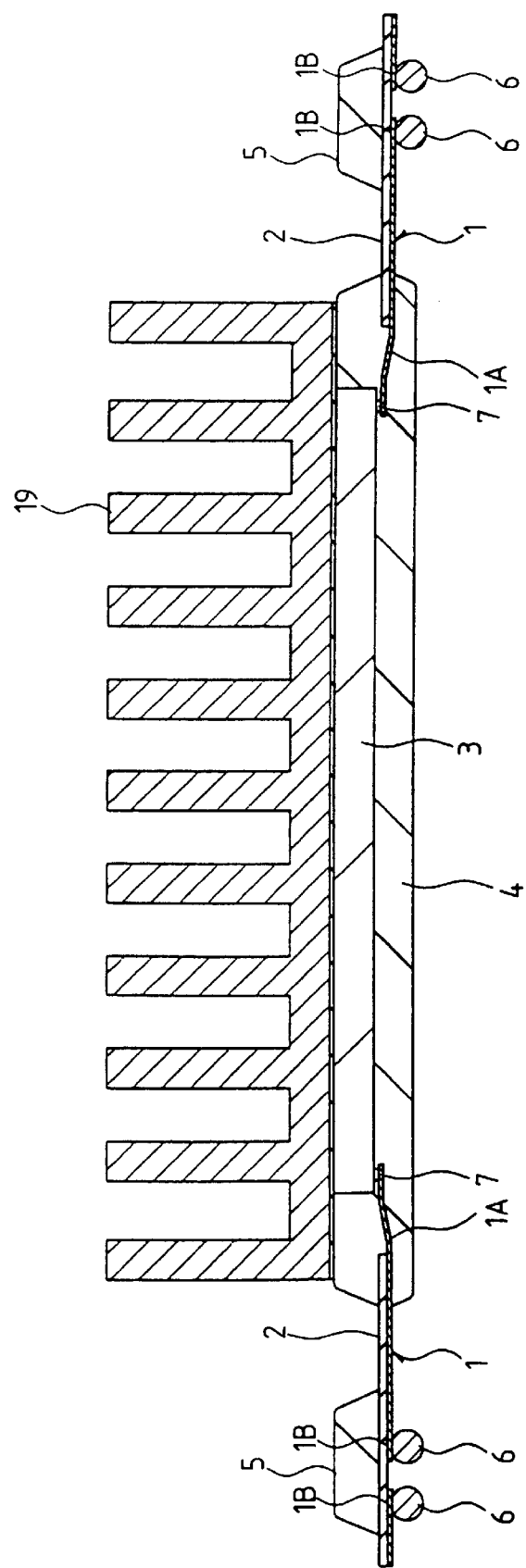

As shown in these drawings, the TBGA in this embodiment has structure that the back of a semiconductor chip 3 is exposed from sealing resin 4. Such structure is effective in reducing the thermal resistance of the TBGA wherein a semiconductor chip 3 having particularly large power consumption is mounted. Also, as shown in FIG. 15, the thermal resistance of the TBGA can be further reduced by bonding a metallic radiation fin 19 to the exposed surface of the semiconductor chip 3 using an adhesive 17 and the like.

To manufacture the TBGA wherein the back of the semiconductor chip 3 is exposed from the sealing resin 4, first, a mold having a cavity shallower than the mold shown in FIG. 8 in the first embodiment is prepared, resin is injected in the cavity in a state in which tape base material 2A is mounted so that the back of the semiconductor chip 3 is in contact with an upper mold of the mold and the sealing resin 4 has only to be formed.

Third Embodiment

Figure 16:
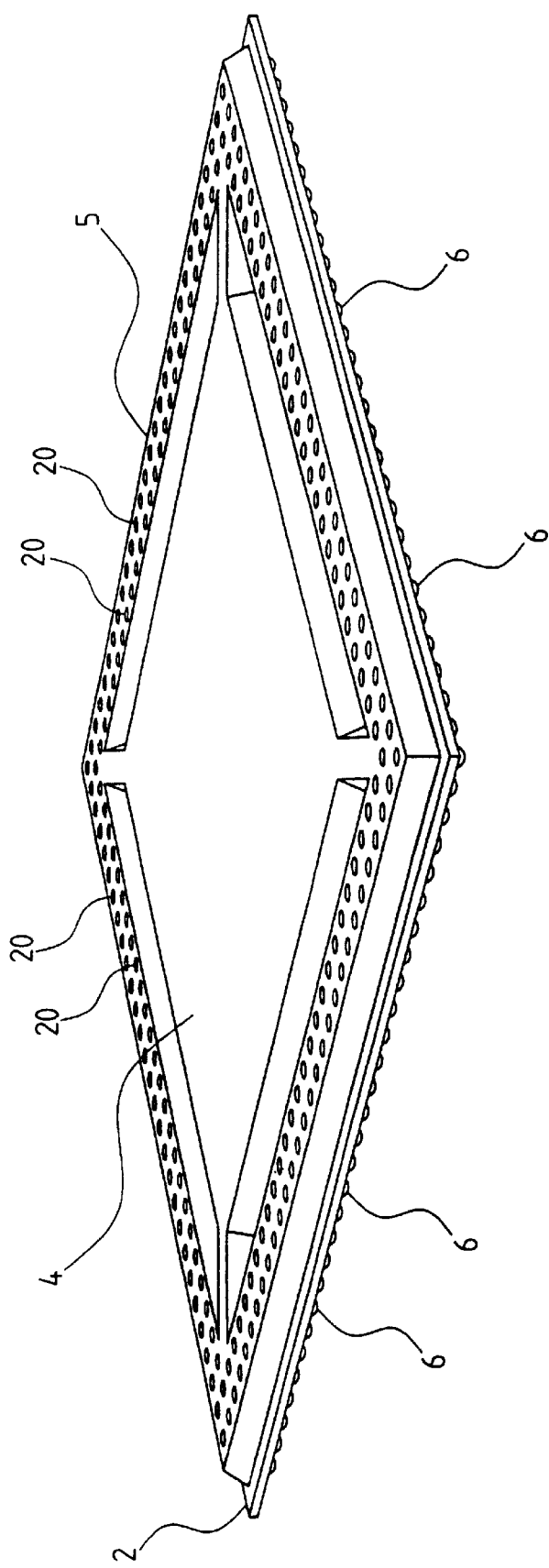
FIG. 16 is a perspective view showing a semiconductor device equivalent to a third embodiment of the invention.
Figure 17:
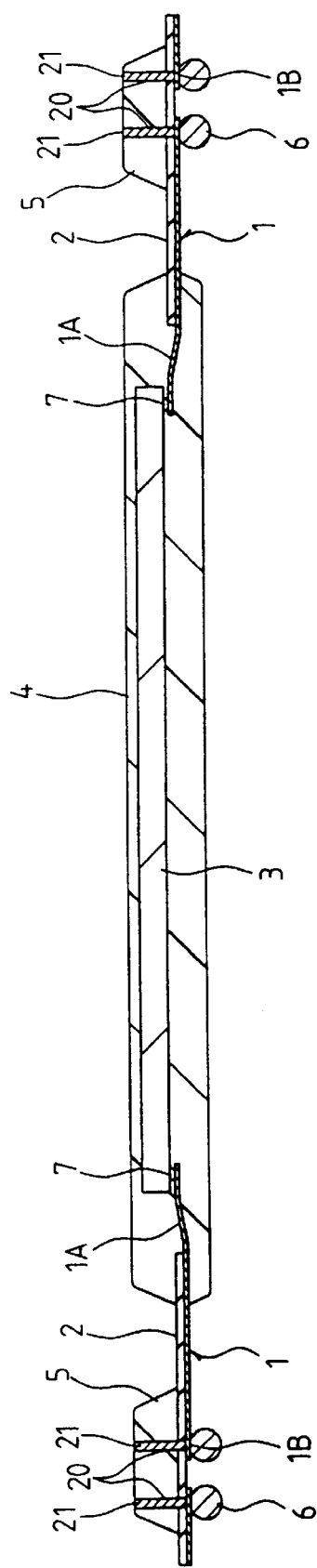
FIG. 17 is a sectional view showing the semiconductor device equivalent to the third embodiment of the invention.

FIG. 16 is a perspective view showing TBGA equivalent to this embodiment and FIG. 17 is a sectional view showing the TBGA.

Figure 18:
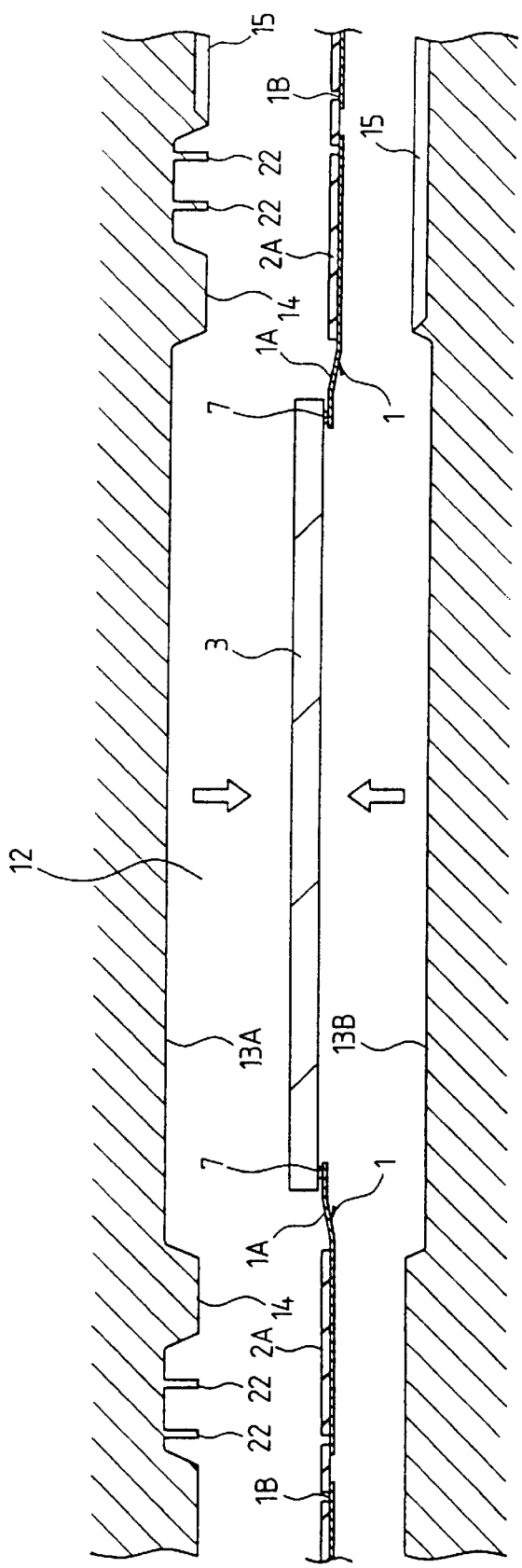
FIG. 18 is a schematic sectional view showing a manufacturing method of the semiconductor device equivalent to the third embodiment of the invention.

As shown in these drawings, multiple through holes 20 that reach a land 1B of a lead 1 through the respective upper and lower surfaces of a reinforcing frame 5 of the TBGA and a wiring board 2 under it are provided, and conductive material 21 is embedded inside each through hole 20. The conductive material 21 is made of solder, conductive paste respectively having a higher melting point than that of a solder bump 6 connected to the land 1B and is filled inside the through hole 20 by screen printing or a dispenser provided with a multipoint nozzle. To form the through hole 20 inside the reinforcing frame 5, the reinforcing frame 5 is formed using a mold in a part of an upper mold 13A of which multiple pins 22 are provided, as shown in FIG. 18.

Figure 19:
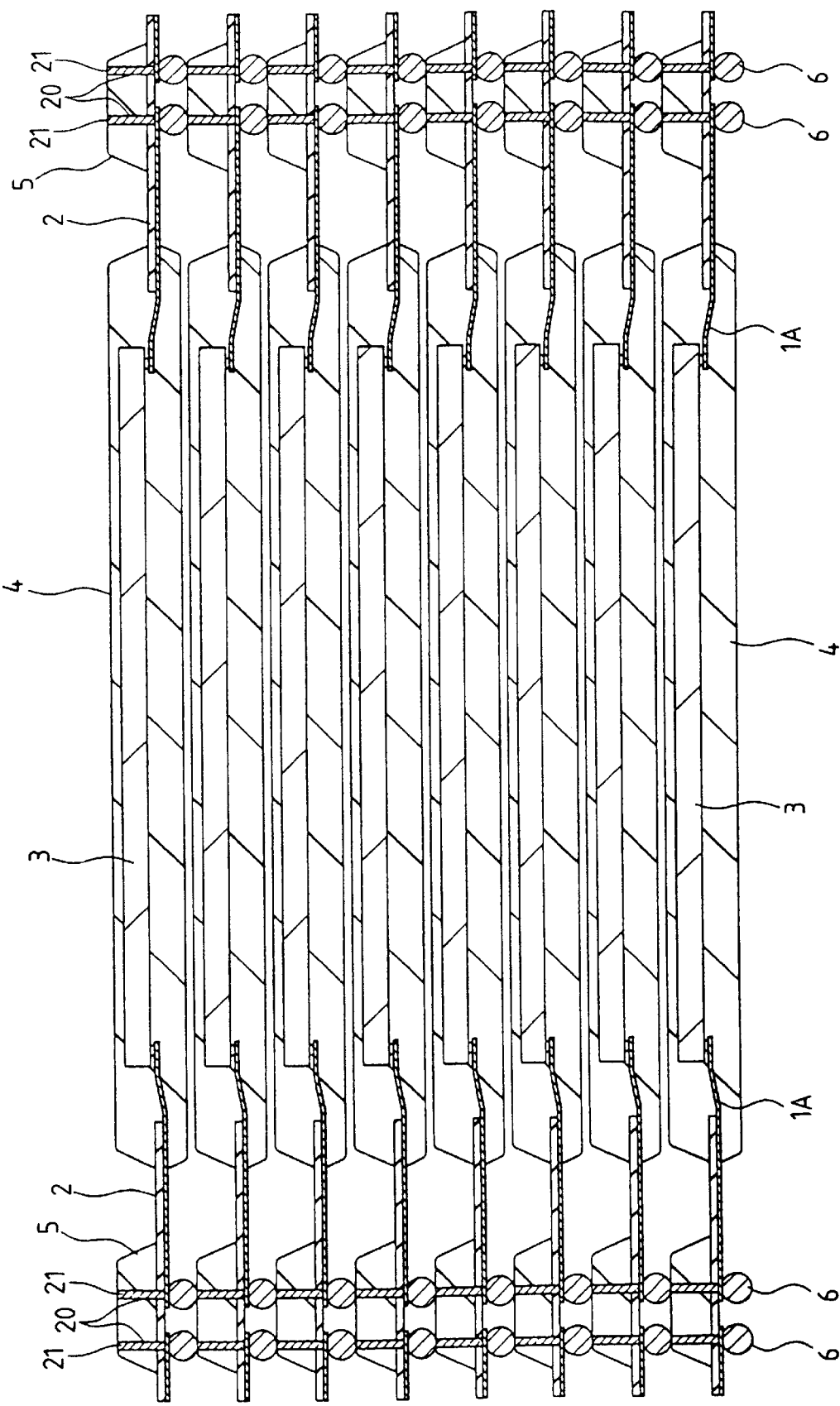
FIG. 19 is a sectional view showing a multichip module using the semiconductor device equivalent to the third embodiment of the invention.

A multichip module wherein plural TBGAs are overlapped in a direction perpendicular to the mounted surface of the board by configuring TBGA so that it has the structure described above as shown in FIG. 19 and common pins are electrically connected via the solder bumps 6 and the conductive materials 21 can be easily realized. In this case, a semiconductor chip 3 wherein memory LSI such as DRAM is formed is used.

Fourth Embodiment

Figure 20:
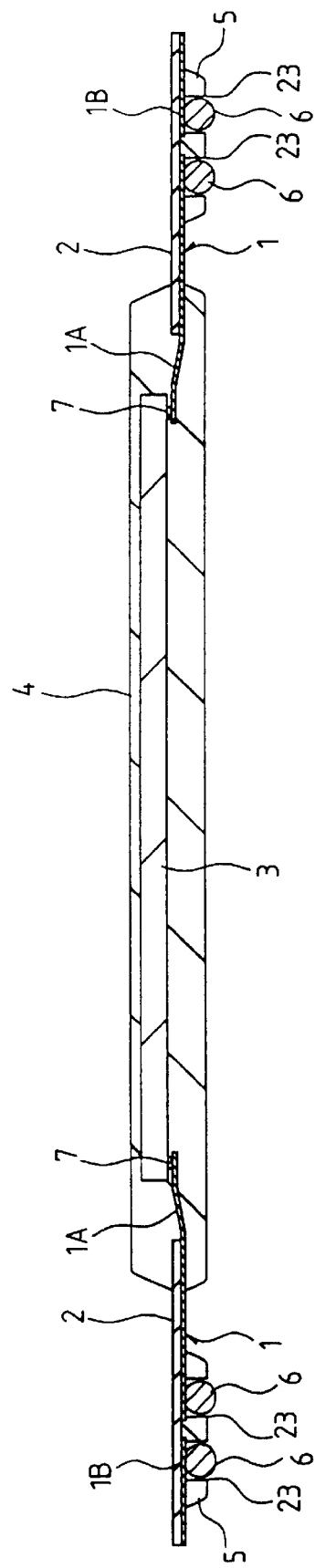
FIG. 20 is a sectional view showing a semiconductor device equivalent to a fourth embodiment of the invention.
Figure 21:
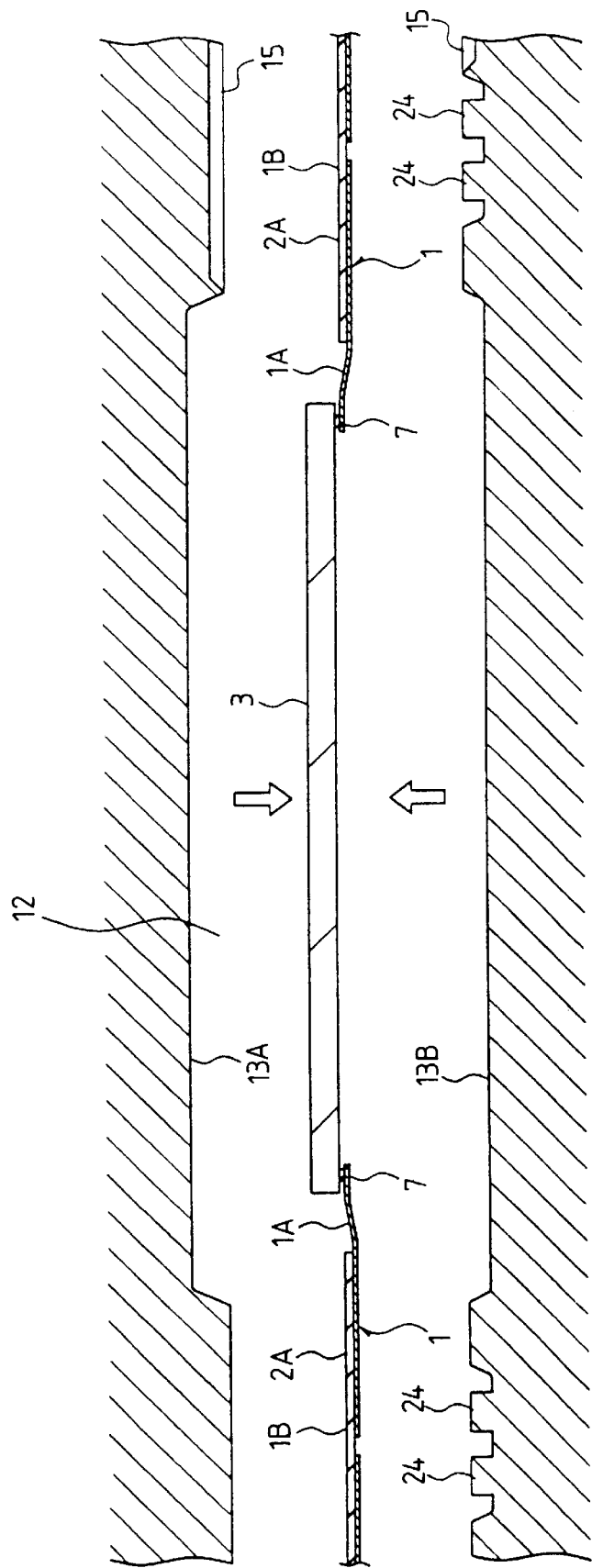
FIGS. 21 and 22 are schematic sectional views showing a manufacturing method of the semiconductor device equivalent to the fourth embodiment of the invention.

FIG. 20 is a sectional view showing TBGA equivalent to this embodiment. As shown in FIG. 20, the TBGA has structure in which a reinforcing frame 5 is provided on the lower side of a wiring board 2 and a solder bump 6 is arranged inside a concave groove 23 formed by the reinforcing frames 5. To form the concave groove 23 between the reinforcing frames 5, the reinforcing frame 5 is formed using a mold in a part of a lower mold 13B of which multiple projections 24 are provided as shown in FIG. 21.

Figure 22:
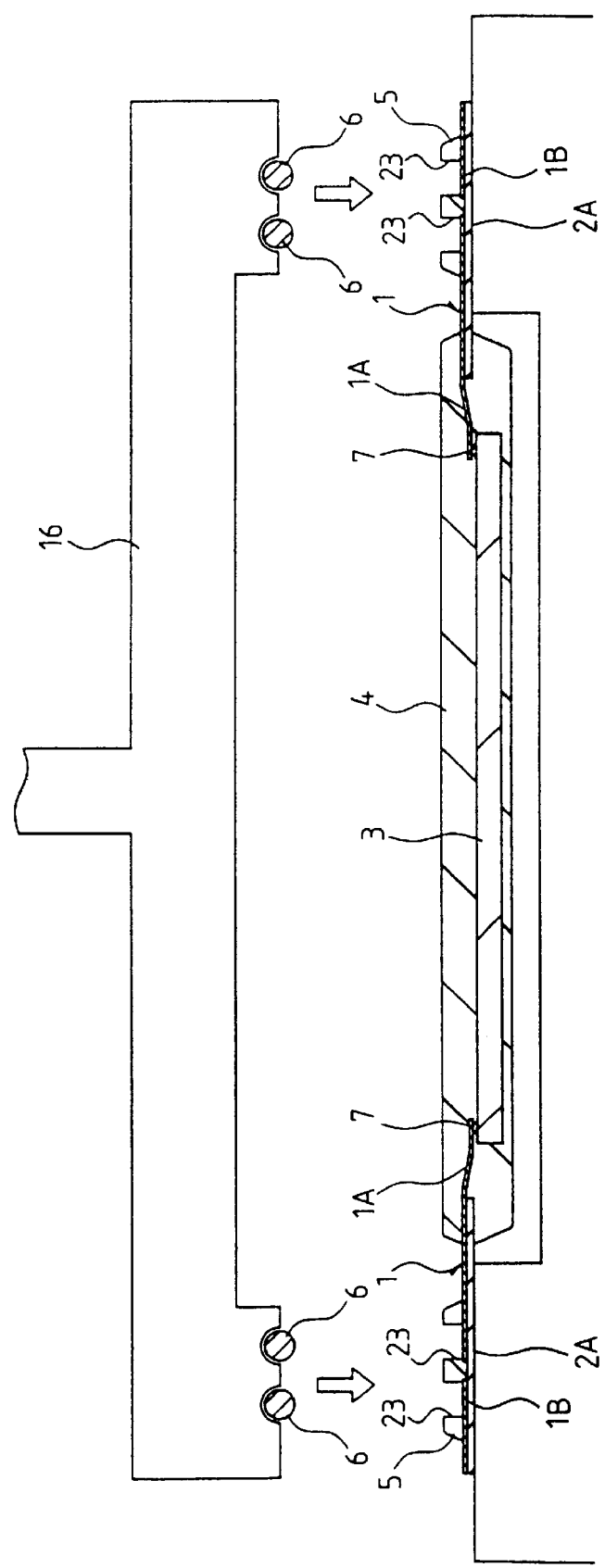

As the concave groove 23 functions as a positioning guide of the solder bump 6 by configuring the TBGA so that it has structure described above as shown in FIG. 22 when the solder bump 6 is tacked to a land 1B using a ball mounter 16, the solder bump 6 can be easily and promptly tacked. In this case, the reinforcing frame 5 also functions so that tape base material 2A in an area in which the land 1B is formed is prevented from being warped and deformed.

The present invention made by these inventors has been concretely described based upon the embodiments of the invention above, however, the present invention is not limited to the embodiments and it need scarcely be said that the present invention can be variously varied in a range not deviated from the objects.

Figure 23:
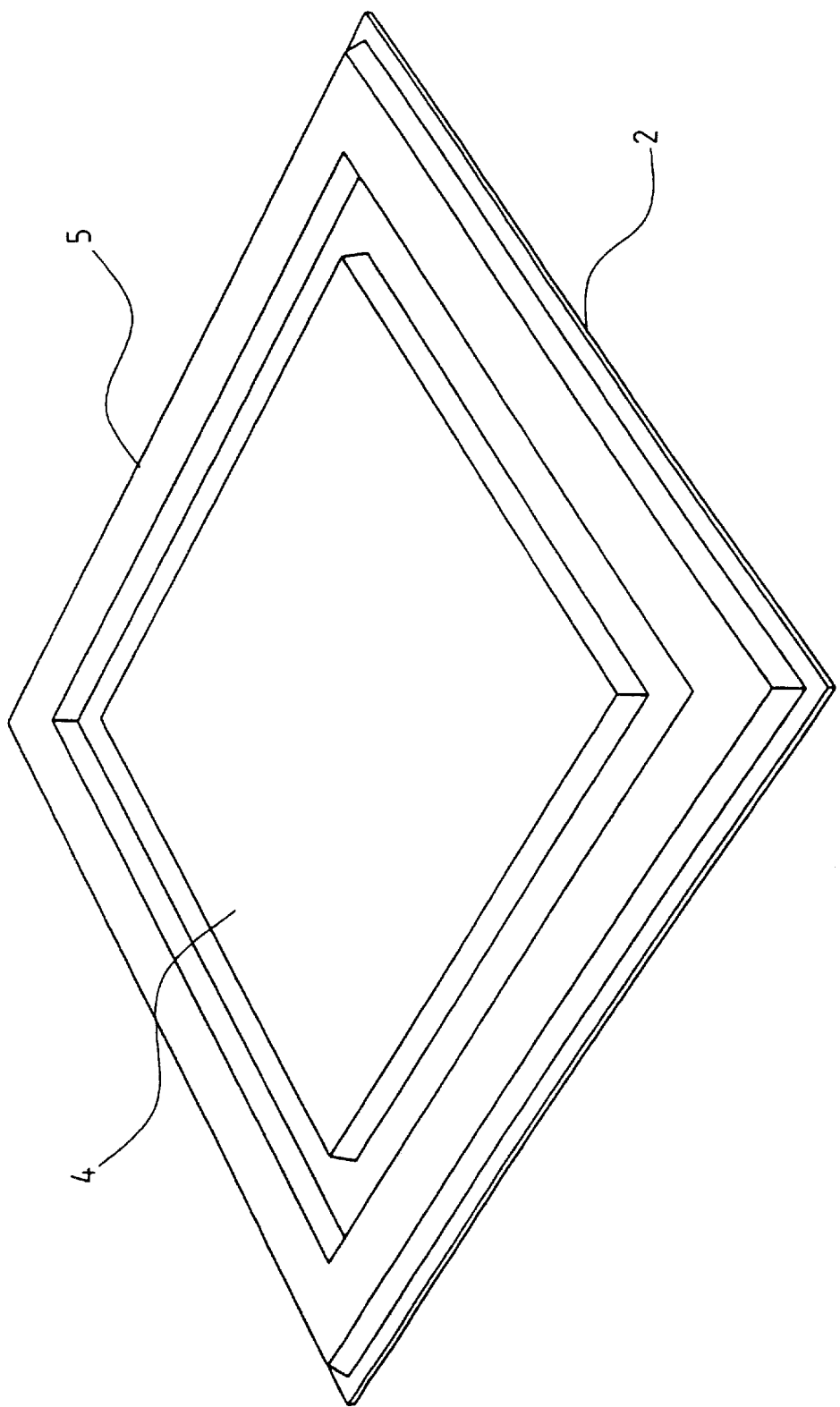
FIG. 23 is a perspective view showing a semiconductor device equivalent to the other embodiment of the invention.

As shown in FIG. 23 for example, sealing resin 4 and a reinforcing frame 5 may be also separated. In this case, plural gates for directly supplying resin to a cavity (12) of a mold for forming the sealing resin 4 and a part of an upper mold (13A) for forming the reinforcing frame 5 are required to be provided.

INDUSTRIAL AVAILABILITY

As the TBGA according to the invention wherein the sealing resin for sealing the semiconductor chip and the reinforcing frame for preventing the wiring board from being warped and deformed are simultaneously formed by resin by transfer molding is low-priced in the manufacturing cost and is high in the reliability, it can be widely applied to mounting in small lightweight electronic equipment such as portable information equipment, a digital camera and a notebook-sized personal computer.

What is claimed is:

1. A method of manufacturing a semiconductor device comprising the steps of:

providing a semiconductor chip having a main surface and a plurality of electrodes on the main surface;

providing a tape base material having a device hole and a plurality of leads, wherein one end of the leads is extended inside the device hole and a part of the other end of the leads forms lands for connecting bump electrodes;

arranging a semiconductor chip in the device hole of the tape base material and electrically connecting the semiconductor chip and the one end of the lead; and monolithically forming a sealing resin for sealing the semiconductor chip and a reinforcing frame surrounding the periphery of the sealing resin by transfer molding with fixing the tape base material in an area between the semiconductor chip and the reinforcing frame by a lower mold and a projection of an upper mold.

2. A method of manufacturing a semiconductor device according to claim 1, further comprising a step of removing an unnecessary part of the tape base material after the step of forming the sealing resin.

3. A method of manufacturing a semiconductor device according to claim 1, further comprising a step of forming a plurality of bump electrodes on the lands of the leads.

* * * * *